United States Patent [19]

Colleran

[11] Patent Number: 5,364,280
[45] Date of Patent: Nov. 15, 1994

[54] PRINTED CIRCUIT BOARD CONNECTOR ASSEMBLY

[75] Inventor: Stephen A. Colleran, Lisle, Ill.

[73] Assignee: Molex Incorporated, Lisle, Ill.

[21] Appl. No.: 93,122

[22] Filed: Jul. 16, 1993

[51] Int. Cl.⁵ .......................................... H01R 23/70
[52] U.S. Cl. ...................................... 439/76; 439/79
[58] Field of Search .................... 439/76, 79, 80, 596; 361/736–743

[56] References Cited

U.S. PATENT DOCUMENTS

| | | | |
|---|---|---|---|
| Re. 32,540 | 11/1987 | Murphy | 206/329 |
| 4,015,070 | 3/1977 | Theurer | 439/76 |
| 4,758,168 | 7/1988 | Awakowicz et al. | 439/83 |
| 4,989,318 | 2/1991 | Utunomiya et al. | 29/843 |
| 5,052,953 | 10/1991 | Weber | 439/857 |
| 5,092,035 | 3/1992 | McMichen et al. | 29/845 |
| 5,099,391 | 3/1992 | Maggelet | 361/736 |
| 5,210,937 | 5/1993 | Delamoreaux | 29/839 |

FOREIGN PATENT DOCUMENTS 4037603  5/1991  Germany .............................. 439/76

Primary Examiner—Neil Abrams
Attorney, Agent, or Firm—A. A. Tirva

[57] ABSTRACT

An electrical connector assembly includes a circuit board having a plurality of terminals mounted thereon. The circuit board is positionable within an enclosure which includes a side wall hingedly connected to a base wall. The side wall defines a header housing adapted for receiving an edge of the circuit board with the terminals projecting through apertures in the side wall.

17 Claims, 3 Drawing Sheets

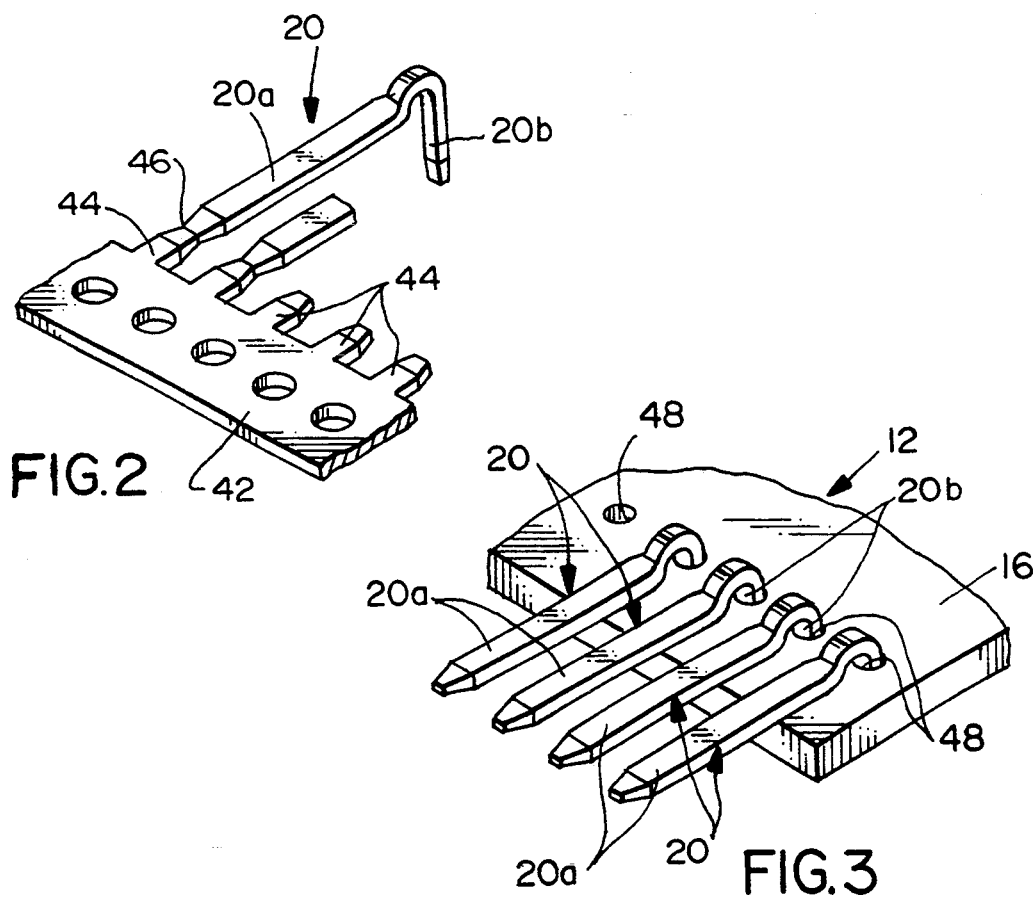
FIG. 2
FIG. 3
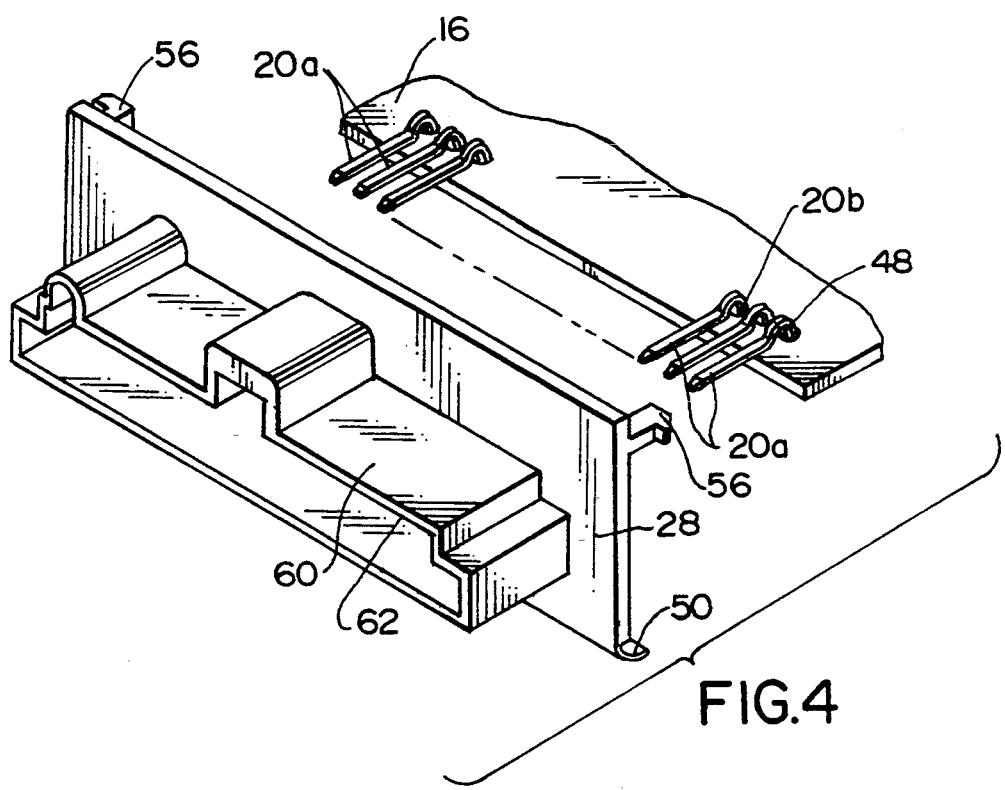
FIG. 4

5,364,280

PRINTED CIRCUIT BOARD CONNECTOR ASSEMBLY

FIELD OF THE INVENTION

This invention generally relates to the art of electrical connectors and, particularly, to an electrical connector assembly having a printed circuit board, with terminals thereon, mounted within an enclosure.

BACKGROUND OF THE INVENTION

Electrical connectors for printed circuit boards often are called "header" connectors and include dielectric housings for mounting a plurality of terminals. The housing includes receptacle means for receiving the printed circuit board, usually an edge of the board, in position for engagement of the terminals with circuit traces on the board. The housing usually is molded of plastic material and typically includes passages, partitions or the like for holding the terminals on predetermined centers or a prescribed "pitch". Such mounting means or spacing means inherently place a limit on close centering of the terminals.

This invention is directed to solving problems encountered with header connectors as described above, by eliminating the header housing which mounts or holds the terminals. In turn, the terminals are mounted directly to the printed circuit board. Elimination of the housing increases the "real estate" on the printed circuit board, reduces the costs of fabricating the assembly and improves the heat dissipation from the terminals by more efficient convection. The terminals can be mounted to the printed circuit board directly from a carrier strip in a stamping and forming operation which maintains the close spacing between the terminal centers. The circuit board, with the mounted terminals, then are assembled to a header housing which is part of an enclosure to house the printed circuit board.

SUMMARY OF THE INVENTION

An object, therefore, of the invention is to provide a new and improved printed circuit board connector assembly of the character described.

Generally, the connector assembly includes a circuit board having a plurality of terminals mounted on the board. A header housing is adapted for receiving an edge of the circuit board, with the terminals in position for engaging terminal contacts of a complementary mating connector. The invention contemplates that the header housing form one wall of an enclosure for the circuit board. The wall is hingedly connected to a base portion of the enclosure.

More particularly, the terminals include contact pin portions projecting from the edge of the board generally parallel to the board. The contact pin portions project outwardly of the enclosure through aperture means in the one wall which defines the header housing. Preferably, the enclosure is fabricated of plastic material, and the wall which defines the header housing is hingedly connected to the base portion by an integral or "living" hinge means.

As disclosed herein, the enclosure is generally orthogonal in configuration with a plurality of side walls projecting upwardly from a base wall defined by the base portion. The header housing is defined by one of the side walls. Means are provided for facilitating mounting the base wall to a support structure. A cover is provided for closing the enclosure.

Still further, the side wall which defines the header housing includes a shroud portion on the outside thereof for surrounding the contact pin portions which project through the aperture means in the wall. Guide means are provided on the inside of the wall for receiving the edge of the printed circuit board, with the contact pin portions projecting through the aperture means. Lastly, latch means are provided on the enclosure for holding the hinged side wall in a closed position. Therefore, the side wall which defines the header housing can be pivoted outwardly to facilitate mounting the printed circuit board thereon and then pivoted to a closed position moving the printed circuit board therewith to a position within the enclosure.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 2 is a fragmented perspective view of a carrier strip from which the terminals are fabricated;

FIG. 3 is a fragmented perspective view of a corner of the circuit board with some of the terminals mounted thereon;

FIG. 4 is a perspective view of the outside of the header housing formed by one of the enclosure walls, along with a fragmented perspective view of the terminal edge of the circuit board;

FIG. 5 is a perspective view of the inside of the header housing; and

DETAILED DESCRIPTION OF THE PREFERRED EMBODIMENT

Figure 1:
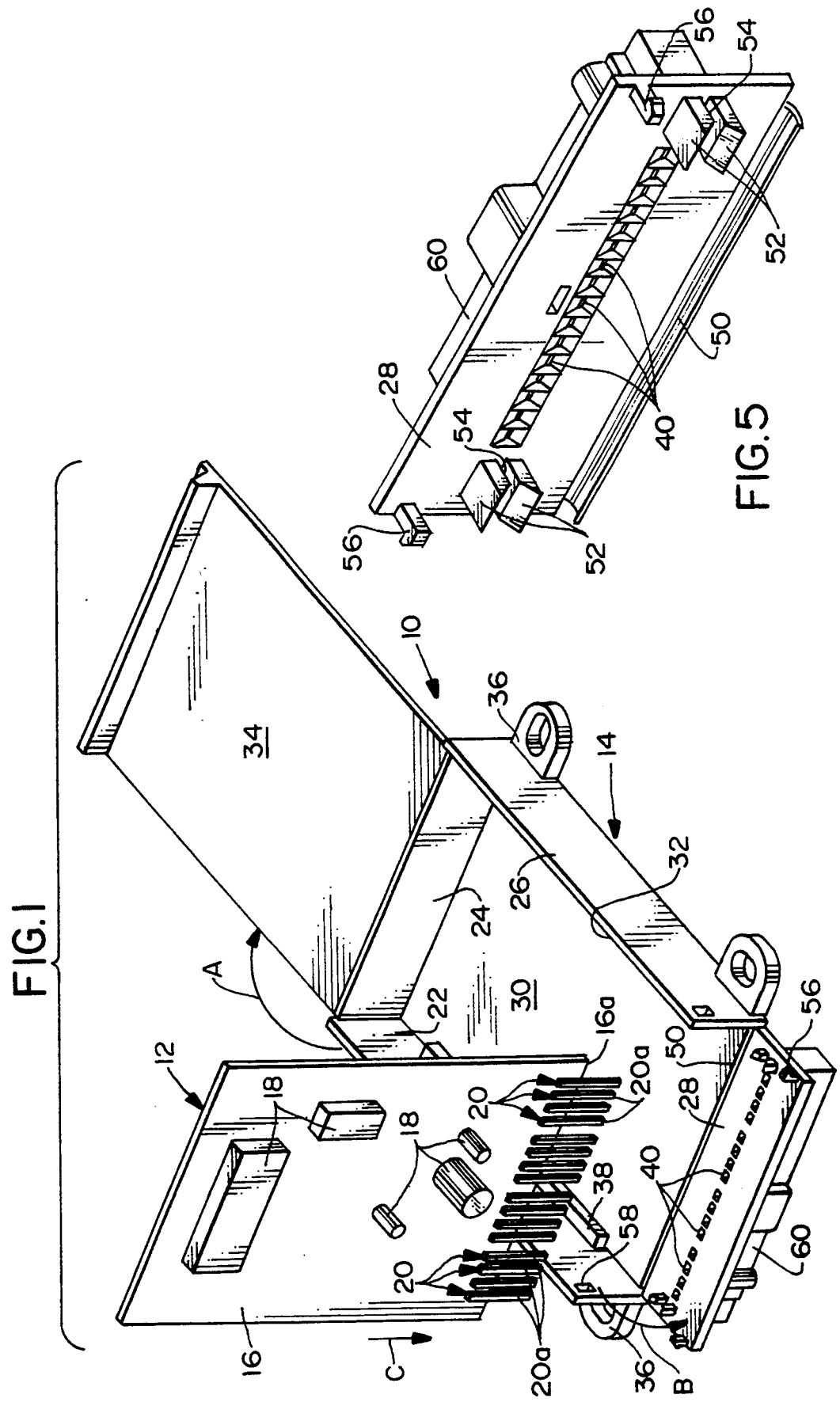
FIG. 1 is an exploded perspective view of the electrical connector assembly of the invention, with the header housing wall and the cover of the enclosure in open condition.

Referring to the drawings in greater detail, and first to FIG. 1, the invention is embodied in an electrical connector assembly, generally designated 10, which includes a printed circuit board, generally designated 12, mountable within an enclosure, generally designated 14. The printed circuit board includes a circuit board 16 having a plurality of circuit components 18 on a top side thereof, the circuit components being connected by appropriate circuit traces (not shown) directly or indirectly to one or more of a plurality of terminals, generally designated 20. Each terminal includes a contact pin portion 20a projecting from an edge 16a of circuit board 16.

Still referring to FIG. 1, enclosure 14 is generally orthogonal in configuration, a rectangular configuration in the exemplary embodiment. More particularly, the enclosure includes a plurality of side walls 22, 24, 26 and 28 which project upwardly from a base wall 30. The walls define an enclosed space or cavity 32. A cover 34 may be provided to close the enclosure. The entire enclosure may be unitarily molded of dielectric material, such as plastic or the like, and a plurality of outwardly projecting apertured tabs 36 may be provided for facilitating mounting the enclosure and, thereby, the connector assembly to an appropriate support structure. Ribs 38 may be provided on base wall 30, at the junctures thereof with side walls 22 and 26, on which circuit board 16 can rest within the enclosure but spaced above the base wall. As will be described in greater detail hereinafter, side wall 28 forms a header housing for printed circuit board 12, with contact pin portions 20a of terminals 20 projecting through a plurality of apertures 40 in the wall.

Turning next to FIGS. 2 and 3, terminals 20 are shown to be fabricated in a conventional stamping and forming operation, wherein the terminals are interconnected to a carrier strip 42 by webs 44. The terminals can be broken from the webs and the carrier strip at weakened coined areas 46 which define the distal ends of contact pin portions 20a. It can be seen that the terminals have tail portions 20b for insertion into holes 48 in circuit board 16, whereby the tail portions can be soldered to appropriate circuit traces on the board and/or in the holes. Therefore, it can be seen that the terminals are mounted directly to the circuit board and can be mounted on closely spaced centers because there are no limitations placed thereon by surrounding portions of a header housing.

Turning to FIGS. 4 and 5 in conjunction with FIG. 1, side wall 28 of enclosure 14 forms a header housing for mounting printed circuit board 12. More particularly, as stated above, contact pin portions 20a of terminals 20 are inserted through apertures 40 in the wall or housing. The wall is connected to base wall 30 by hinge means which, preferably, is provided by an integral or "living" hinge 50 which is best seen in FIG. 5. In other words, the living hinge can be molded integrally with the entire enclosure 14. The inside of the wall includes a pair of chamfered bosses 52 at each opposite end of the wall to define slots 54 for receiving edge 16a (FIG. 1) of circuit board 16, as contact pin portions 20a of the terminals are inserted into apertures 40. A pair of hooked latch arms 56 also are integrally molded with opposite ends of side wall 28 for snap-latching engagement within holes 58 (FIG. 1) in side walls 22 and 26 to hold side wall 28 in a closed position. Lastly, a shroud 60 is integrally molded with side wall 28 to project from the outside thereof and surrounds contact pin portions 20a of the terminals which project through apertures 40 in the wall. The shroud defines a receptacle 62 for a mating portion of a complementary connector (not shown) which includes appropriate terminal contacts, such as sockets, for engaging contact pin portions 20a within the shroud.

In assembly, terminals 20 are mounted to circuit board 16 as described above in relation to FIGS. 2 and 3. Enclosure 14 is "opened" as shown in FIG. 1. In other words, cover 34 is pivoted in the direction of arrow "A" to its open position, as shown. The cover may be connected to the top of side wall 24 by a living hinge, similar to hinge 50 for side wall 28. The header housing defined by side wall 28 is opened in the direction of arrow "B" to the position shown in FIG. 1. Printed circuit board 12 then is moved in the direction of arrow "C" to insert contact pin portions 20a into apertures 40 in side wall 28 which defines the header housing. The side wall, along with printed circuit board 12, then is rotated opposite the direction of arrow "B" to pivot the printed circuit board into cavity 32 of enclosure 14 and onto ribs 38. In its closed position, hooked latch arms 56 of wall 28 will latchingly engage in holes 58 of side walls 22 and 26. Cover 34 then can be closed, such as pivoting about its living hinge opposite the direction of arrow "A". The entire assembly now is ready to be mounted on a support structure, such as by using fastening means through apertured tabs 36.

Figure 6:
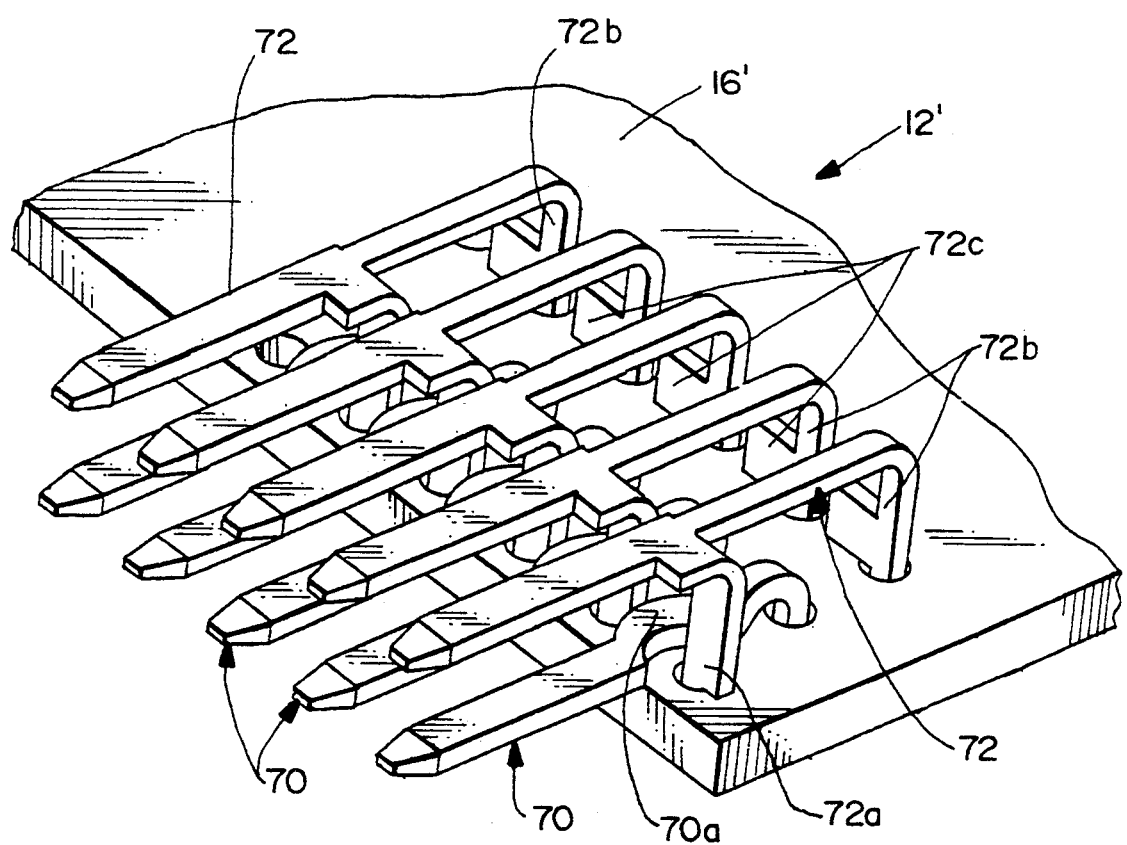
FIG. 6 is a perspective view similar to that of FIG. 3, but showing an embodiment which includes two rows of terminals.

Lastly, FIG. 6 shows an alternate embodiment of a printed circuit board, generally designated 12', which includes a circuit board 16' mounting two rows of terminals, generally designated 70 and 72. Terminals 70 are mounted similar to terminals 20 but include notched areas 70a for allowing mounting of tail portions 72a of terminals 72. The second row of terminals 72 include second tail portions 72b, along with tab portions 72c which effectively elevate terminals 72 in a second row above terminals 70. This depiction simply illustrates that a variety of terminal configurations can be used with the invention and, of course, side wall 28 which defines the header housing of connector assembly 10 correspondingly can be modified to accommodate various terminal arrangements.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. In an electrical connector assembly which includes a circuit board, a plurality of terminals mounted on the circuit board, and a header housing adapted for receiving an edge of the circuit board with the terminals in position for engaging terminal contacts of a complementary mating connector,
the improvement wherein said header housing comprises one wall of an enclosure for said circuit board, the wall being hingedly connected to a base portion of the enclosure.

2. In an electrical connector assembly as set forth in claim 1, wherein said terminals include contact pin portions projecting outwardly of said enclosure through aperture means in said wall.

3. In an electrical connector assembly as set forth in claim 2, wherein said terminals are mounted to the circuit board with the contact pin portions projecting from said edge generally parallel to the board.

4. In an electrical connector assembly as set forth in claim 1, wherein said enclosure is fabricated of plastic material and said wall is hingedly connected to the base portion by an integral hinge means.

5. In an electrical connector assembly as set forth in claim 1 wherein said enclosure is generally orthogonal in configuration, with a plurality of side walls projecting upwardly from a base wall defined by said base portion, and said one wall defines one of said side walls.

6. In an electrical connector assembly as set forth in claim 5, including means for facilitating mounting the base wall to a support structure.

7. In an electrical connector assembly as set forth in claim 5, including a cover for closing the enclosure.

8. In an electrical connector assembly as set forth in claim 1, wherein said one wall includes a shroud portion on the outside thereof for surrounding contact portions of the terminals projecting through the wall.

9. In an electrical connector assembly as set forth in claim 1, including latch means on the enclosure for holding said one wall in a closed position.

10. In an electrical connector assembly as set forth in claim 1, wherein said one wall includes guide means on the inside thereof for receiving said edge of the circuit board with contact portions of the terminals projecting through said one wall.

11. An electrical connector assembly, comprising:
an enclosure including a base wall and a plurality of upstanding side walls, one of said side walls defining a connector housing having aperture means therethrough and a mating portion on the outside thereof for interfacing with a mating portion of an appropriate complementary connector;
a circuit board sized for positioning in the enclosure and including a plurality of terminals mounted thereon, the terminals having contact portions projecting through the aperture means into the mating portion of the connector housing for engaging appropriate terminal contacts of the complementary connector; and
wherein said one side wall is connected to the base wall by hinge means to allow the one side wall to be pivoted outwardly to facilitate mounting the circuit board thereon and then pivoted to a closed position moving the circuit board therewith to a position within the enclosure.

12. The electrical connector of claim 11 wherein said enclosure is fabricated of plastic material and said one side wall is hingedly connected to the base wall by an integral hinge means.

13. The electrical connector of claim 11 wherein said one side wall includes a shroud portion on the outside thereof for surrounding the contact portions of the terminals projecting through said aperture means.

14. The electrical connector of claim 11, including a cover for closing the enclosure.

15. The electrical connector of claim 11, including latch means on the enclosure for holding said one side wall in a closed position.

16. The electrical connector of claim 11 wherein said one side wall includes guide means on the inside thereof for receiving said edge of the circuit board with the contact portions projecting through said aperture means.

17. The electrical connector of claim 11 wherein said terminals are mounted on the circuit board with the contact portions thereof projecting from an edge of the board and generally parallel to the board.

* * * * *